United States Patent [19]

Ohkubo et al.

[11] Patent Number: 4,849,065
[45] Date of Patent: Jul. 18, 1989

[54] CRYSTAL GROWING METHOD

[75] Inventors: Yasunori Ohkubo; Toshihiko Suzuki; Nobuyuki Izawa, all of Kanagawa, Japan

[73] Assignee: Sony Corporation, Tokyo, Japan

[21] Appl. No.: 100,969

[22] Filed: Sep. 25, 1987

[30] Foreign Application Priority Data

Sep. 25, 1986 [JP]  Japan .................. 61-227027

[51] Int. Cl.$^4$ ........................................ C30B 15/22
[52] U.S. Cl. ............................. 156/617.1; 363/45; 363/47
[58] Field of Search ............... 156/619, 617 SP, 624, 156/617.1, 619.1; 363/45, 46, 47; 422/249

[56] References Cited

U.S. PATENT DOCUMENTS

| 3,317,819 | 5/1967 | Brodie | 363/45 |
| 3,550,030 | 12/1970 | Blanyer | 363/45 |
| 3,551,780 | 12/1970 | Gautherin | 363/46 |
| 3,710,148 | 1/1973 | Itoh | 363/45 |
| 3,859,590 | 1/1975 | Cielo et al. | 363/45 |
| 4,393,441 | 7/1983 | Enge | 363/61 |
| 4,565,671 | 1/1986 | Matsutani et al. | 422/249 |
| 4,592,895 | 6/1986 | Matsutani et al. | 422/249 |
| 4,619,730 | 10/1986 | Suzuki et al. | 156/617 SP |

FOREIGN PATENT DOCUMENTS 60-51690  7/1985  Japan .

Primary Examiner—John Doll
Assistant Examiner—R. Bruce Breneman
Attorney, Agent, or Firm—Hill, Van Santen, Steadman & Simpson

[57]         ABSTRACT

A crystal growing method for growing a crystal from a raw material melt highly magnetic field is being applied to the raw material melt, the electromagnet for applying the magnetic field being supplied with a direct current having a ripple factor of less than 5% to thereby grow a crystal with good crystallinity properties.

2 Claims, 2 Drawing Sheets

CRYSTAL GROWING METHOD

BACKGROUND OF THE INVENTION

1. Field of the Invention

The present invention relates to a method for growing crystals more particularly semiconductor single crystals such as Si, GaAs, or the like, and more particularly to a method of growing crystals while a magnetic field is being applied to the melt during crystal growth.

2. Description of the Prior Art

Methods of growing a crystal in a magnetic field are industrially important since these methods produce a high quality crystal of Si, GaAs, or the like. One such method is disclosed, for example, in Japanese Patent Publication No. 58-50951. This previously proposed method for growing crystals will be more fully explained in connection with FIG. 1.

In FIG. 1, reference 1 indicates generally a single crystal growing apparatus which is adapted to carry out the above mentioned crystal growing method. Reference 2 refers to a melt of a raw material such as a silicon melt contained in a container 3 consisting, for example, of a crucible made of quartz for accommodating the melt 2. About the outer periphery of the container 3, there is arranged a heating means 4 composed of an electric heater 5 which, for example, takes the form of a zig-zag pattern and forms a cylindrical plane about the outer periphery of the container 3. On the outside of the heating means 4 there is located a jacket 6 which is cooled by means of water or the like. Outside the jacket 6, there is a magnetic field generating means 7 comprising an electromagnet which produces a uniform direct magnetic field and consisting, for example, of a constant conductive electromagnet having an iron core or an electromagnet having a constant conductive solenoid coil. Reference 8 indicates a single crystal seed, and 9 refers to a chuck for pulling the single crystal from the melt as it grows, in keeping with conventional technology.

Pulling the single crystal by use of this apparatus is carried out in the following manner When a direct magnetic field is applied to the melt 2 of raw material in a predetermined direction by the magnetic field generating means 7, the single crystal seed 8 is dipped onto the surface of the raw material melt 2 and pulled while a supporting portion of the single crystal seed 8, specifically, a pulling rotational shaft including the chuck 9 and the crucible 3 are rotated relative to each other whereby a single crystal 10 is grown from the single crystal seed 8.

As described, when a crystal is grown while the direct magnetic field is being applied by the magnetic field generating means 7 to the conductive raw material melt 2, the apparent viscosity of the raw material melt 2 is increased by the magnetofluid effect and consequently the surface tension of the raw material melt 2 is increased and the convection of the raw material melt 2 is decreased. Consequently, variations in temperature and vibrations on the surface of the raw material melt 2 are suppressed. It is therefore possible to obtain a variety of advantages such as growing a single crystal 10 having good crystallinity, the reduction in the amount of materials forming the crucible or container 3, a control of the amount of oxygen to the melt 2, and the like, all of which are accomplished by selecting a suitable intensity of the applied magnetic field.

The aforementioned Japanese Patent Publication discloses that it is important to suppress the ripple of current supplied to the electric heater 5 of the heating means 4 to less than 4% for growing a high quality crystal. However, crystal defects such as a lamination defect or the like may occur in a single crystal grown by the above described method in relatively high density.

It has been found that the occurrence of crystal defects depends on the ripple or pulsation of the current flowing through the electromagnet which generates the magnetic field, and that when the ripple of the current flowing through the electromagnet is large, the intensity of the magnetic field varies with time, and an induced current is generated in the crystal growing apparatus, vibrations occur on the surface of the raw material melt, and consequently crystal defects are produced.

To avoid fluctuations in intensity of the magnetic field caused by the ripple of the direct current flowing through the magnetic field generating means, a battery might be employed as a power supply for the electromagnet. However, a battery is not appropriate as a power supply for the magnetic field which requires an electric power ranging from several kilowatts up to or exceeding 100 kilowatts. Accordingly, a rectifier is used as a direct current power supply source for the magnetic field generating means. The rectifier, for example, may be a silicon rectifier of the three phase, full-wave type, or a six phase, half-wave type, or a double star type with an interphase reactor or the like. Theoretically, the ripple factor or the pulsation ratio can be suppressed but this ripple factor can only be obtained where the rectifier is used in the vicinity of the maximum output of the direct power source. If the rectifier is used at a direct current output lower than the value mentioned, the distortion in the output wave form is increased.

SUMMARY OF THE INVENTION

The present invention seeks to eliminate the occurrence of crystal defects in a crystal grown by the above described method wherein crystal growing occurs under a magnetic field.

In accordance with the present invention, there is provided a crystal growing method utilizing a container in which there is a raw material melt for a crystal to be grown, heating means located around the container, and a magnetic field generating means employing an electromagnet for applying a magnetic field in a predetermined direction with respect to the raw material melt. In the method of the present invention, a direct current is applied with a ripple factor of less than 5% to the magnetic field generating means to generate and apply a magnetic field to the raw material melt in a predetermined direction and the crystal growth is carried out from the raw material melt while the magnetic field is applied to the raw material melt.

Other objects, features, and advantages of the present invention will become apparent from the following detailed description of a preferred embodiment taken in conjunction with the accompanying drawings, throughout which like reference numerals designate like elements or parts.

DESCRIPTION OF THE PREFERRED EMBODIMENTS

Figure 1:
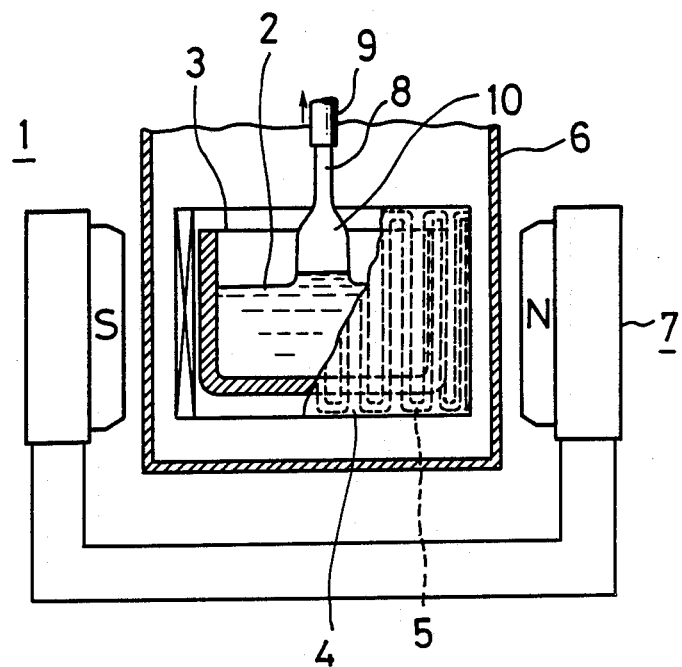
FIG. 1 is a diagram illustrating a construction of crystal growing apparatus used for explaining the method of the present invention.
Figure 2:
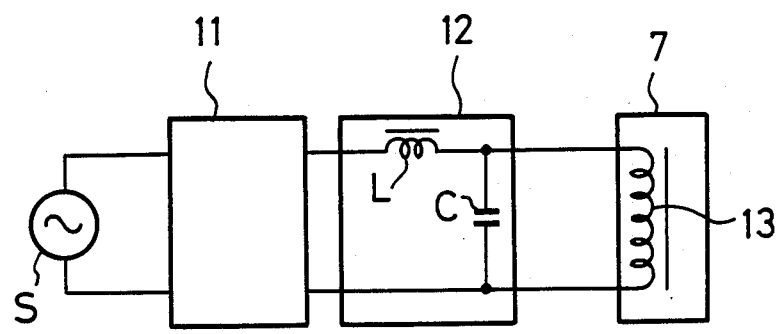
FIG. 2 is a block diagram showing an example of a power supply for the crystal growing apparatus which employs the method of the present invention.

FIG. 2 illustrates an example of the power supply section for the electromagnet of the magnetic field generating means 7 shown in the crystal growing apparatus of FIG. 1. There is shown an alternating current source from an AC power supply S connected across a rectifier circuit 11 and a filter circuit 12 composed of an inductance L and a capacitance C. The current is then applied to a coil 13 of the electromagnet of the magnetic field generating means 7 provided in the crystal growing apparatus as a direct current. By virtue of the use of the filter circuit 12 composed of an LC filter, the filter factor of the direct current can be suppressed to the range of 0.5 to 5%. The filter factor is defined as the ratio of the rms value of the ripple current divided by the steady state d.c. current.

The filter circuit 12 shown in FIG. 2 consists of a single stage LC circuit. When composed of two stages of LC circuits, the ripple factor of the direct current can be suppressed to the range of 0.01 to 0.5%. It will therefore be understood that the ripple factor of the direct current can further be decreased by the use of multistage LC circuits.

Figure 3:
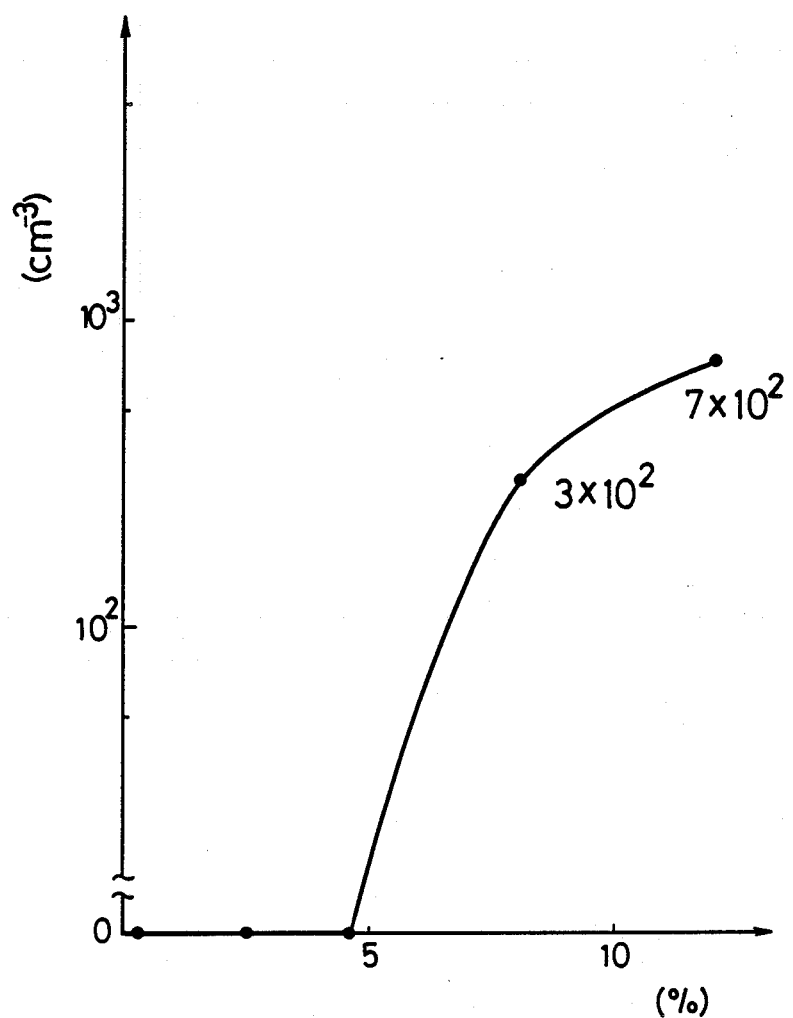
FIG. 3 is a graph showing the relationship of crystal defect density with respect to ripple factor of the current.

FIG. 3 shows the relationship of crystal defect density with respect to the filter factor of the direct current applied to the electromagnet of the magnetic field generating means 7 when a silicon crystal is grown in the apparatus of FIG. 1. It can be seen from this graph that the crystal defect density is greatly decreased by suppresssing the filter factor of the direct current to less than 5%, as in the present invention.

As described above, the present invention is based upon the relationship between variations in the magnetic field generated by the generating means and the crystal defects, which relationship has not been taken into account in the prior art. We have found that control of such variations can greatly decrease the defect density in a grown crystal by suppressing the filter factor of the direct current applied to the magnetic field generating means to less than 5%. Consequently, when various semiconductor devices are manufactured from a semiconductor single crystal according to the present invention, it is possible to manufacture devices of good characteristics with a high yield so that the manufacturing costs can be decreased.

The above description is based upon a single preferred embodiment of the invention but it will be apparent that many modifications and variations can be effected by one skilled in the art without departing from the spirit or scope of the novel concepts of the invention so that the scope of the invention should be determined by the appended claims only.

We claim as our invention:

1. In a crystal growing method wherein a melt for the crystal is subjected to heat and a magnetic field from an electromagnet during crystal growth, the improvement which comprises:

energizing said electromagnet with a direct current which has been converted from an alternating current source and filtered and which has a ripple factor of less than 5% and carrying out the crystal growth while a magnetic field is applied to said melt from said electromagnet.

2. A method according to claim 1, wherein said ripple factor is in the range from 0.01 to 0.5%.

\* \* \* \* \*